US011334124B2

(12) United States Patent
Chao et al.

(10) Patent No.: US 11,334,124 B2
(45) Date of Patent: May 17, 2022

(54) ELECTRONIC DEVICE

(71) Applicants: Kai-Cheng Chao, Taipei (TW);
 Chia-Huang Chan, Taipei (TW);
 You-Yu Chen, Taipei (TW); Chia-Hao Hsu, Taipei (TW)

(72) Inventors: Kai-Cheng Chao, Taipei (TW);
 Chia-Huang Chan, Taipei (TW);
 You-Yu Chen, Taipei (TW); Chia-Hao Hsu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 17/152,794

(22) Filed: Jan. 20, 2021

(65) Prior Publication Data

US 2021/0356999 A1    Nov. 18, 2021

(30) Foreign Application Priority Data

May 15, 2020 (TW) ................................. 109116260

(51) Int. Cl.
 *G06F 1/16* (2006.01)
 *G06F 1/20* (2006.01)
 *H05K 7/20* (2006.01)

(52) U.S. Cl.
 CPC ............ *G06F 1/1681* (2013.01); *G06F 1/203* (2013.01); *H05K 7/20145* (2013.01); *G06F 2200/202* (2013.01)

(58) Field of Classification Search
 CPC .... G06F 1/1681; G06F 1/1616; G06F 1/1652; G06F 2200/202; G06F 2200/203; G06F 1/203; H04M 1/022; E05D 7/00; E05D 11/0054; E05D 3/06; E05D 11/06; E05D 11/10; E05D 11/1014; E05D 11/1028; E05D 7/12; E05D 7/009; H05K 5/0226; H05K 7/16; H05K 7/20145; Y10T 16/525; Y10T 16/547; Y10T 16/5475
 See application file for complete search history.

(56) References Cited

U.S. PATENT DOCUMENTS

| 7,197,790 | B1 * | 4/2007 | Edmondson | .............. E05D 3/16 |
| | | | | 16/286 |
| 10,684,657 | B2 * | 6/2020 | Lin | ........................ F16M 11/10 |
| 10,761,572 | B1 * | 9/2020 | Siddiqui | ............... G06F 1/1616 |
| 10,968,673 | B2 * | 4/2021 | Aagaard | ............. H04M 1/0216 |

(Continued)

FOREIGN PATENT DOCUMENTS

| CN | 108089641 | 5/2018 |
| TW | I478662 | 3/2015 |
| TW | I620488 | 4/2018 |

*Primary Examiner* — Michael A Matey
(74) *Attorney, Agent, or Firm* — JCIPRNET

(57) ABSTRACT

An electronic device including two bodies, at least one hinge assembly, and a hinge cover is provided. The two bodies are pivoted to each other through the hinge assembly. The hinge cover is connected between the two bodies and covers the hinge assembly. The hinge cover includes a plurality of shell parts, and the shell parts are movably connected to each other in sequence. The hinge cover has at least one first heat dissipation opening and at least one heat dissipation flow channel, and the at least one heat dissipation flow channel communicates the first heat dissipation opening and an inner space of at least one of the bodies.

13 Claims, 8 Drawing Sheets

(56) References Cited

U.S. PATENT DOCUMENTS

| | | | | |
|---|---|---|---|---|
| 2004/0114322 A1* | 6/2004 | Agata | ................... | G06F 1/203 |
| | | | | 361/679.27 |
| 2008/0089023 A1* | 4/2008 | Kumhyr | ................. | G06F 1/203 |
| | | | | 361/679.48 |
| 2012/0110784 A1* | 5/2012 | Hsu | ...................... | G06F 1/1681 |
| | | | | 16/226 |
| 2014/0196254 A1* | 7/2014 | Song | .................... | G06F 1/1681 |
| | | | | 16/302 |
| 2015/0131222 A1* | 5/2015 | Kauhaniemi | ........ | G06F 1/1681 |
| | | | | 361/679.27 |
| 2015/0176317 A1* | 6/2015 | Lee | .......................... | E05D 3/06 |
| | | | | 16/251 |
| 2016/0132075 A1* | 5/2016 | Tazbaz | ................. | G06F 1/1681 |
| | | | | 361/679.27 |
| 2016/0132076 A1* | 5/2016 | Bitz | ..................... | H04M 1/022 |
| | | | | 361/679.27 |
| 2016/0147267 A1* | 5/2016 | Campbell | .......... | H04M 1/0216 |
| | | | | 361/679.27 |
| 2016/0215541 A1* | 7/2016 | Tazbaz | ................. | H04M 1/022 |
| 2017/0090523 A1* | 3/2017 | Tazbaz | ................. | H04M 1/022 |
| 2017/0208699 A1* | 7/2017 | McDermid | .......... | G06F 1/1681 |
| 2018/0049329 A1* | 2/2018 | Seo | ....................... | G06F 1/1641 |
| 2018/0067519 A1* | 3/2018 | Tazbaz | ................. | G06F 1/1637 |
| 2018/0110139 A1* | 4/2018 | Seo | ..................... | H05K 5/0226 |
| 2018/0242446 A1* | 8/2018 | Cho | ................... | H04M 1/0268 |
| 2019/0098783 A1* | 3/2019 | Zhang | ................. | H05K 5/0017 |
| 2019/0196541 A1* | 6/2019 | O'Neil | ............... | H04M 1/0216 |
| 2019/0292827 A1* | 9/2019 | Aagaard | .............. | E05D 11/082 |
| 2020/0170128 A1* | 5/2020 | Kim | ...................... | G06F 1/1652 |
| 2020/0383219 A1* | 12/2020 | Hale | ....................... | E05D 3/18 |
| 2020/0387195 A1* | 12/2020 | Kim | ..................... | G06F 1/1618 |
| 2021/0034116 A1* | 2/2021 | Torres | .................. | G06F 1/1616 |
| 2021/0303032 A1* | 9/2021 | Hong | ..................... | F16C 11/10 |

\* cited by examiner

ELECTRONIC DEVICE

CROSS-REFERENCE TO RELATED APPLICATION

This application claims the priority benefit of Taiwan application serial no. 109116260, filed on May 15, 2020. The entirety of the above-mentioned patent application is hereby incorporated by reference herein and made a part of this specification.

BACKGROUND

Technical Field

The disclosure relates to an electronic device, and more particularly, to an electronic device including a hinge assembly.

Description of Related Art

With development and popularization of consumer electronics, new designs of foldable electronic devices including notebook computers are continuously developed, and various types of hinge assemblies of the electronic devices have become available, e.g., single-shaft type, double-shaft type, or multi-shaft type hinge assemblies. To give a better look of the electronic devices, hinge covers are generally used to cover the hinge assemblies, while the variety of types of the hinge assemblies is associated with variation and difficulty of designing and assembling the hinge covers. On the other hand, continuous improvement of the performance of the electronic devices is also accompanied by the demand for heat dissipation. Therefore, how to properly cover the hinge assemblies by the hinge covers and enhance the heat dissipation capacity of the electronic devices has become an important topic of hinge design of the foldable electronic devices at present.

SUMMARY

The disclosure provides an electronic device with good heat dissipation capacity, and a hinge assembly of the electronic device may be properly covered.

An embodiment of the disclosure provides an electronic device that includes two bodies, at least one hinge assembly, and a hinge cover. The two bodies are pivoted to each other through the hinge assembly. The hinge cover is connected between the two bodies and covers the hinge assembly. The hinge cover includes a plurality of shell parts, and the shell parts are movably connected to each other in sequence. The hinge cover has at least one first heat dissipation opening and at least one heat dissipation flow channel, and the heat dissipation flow channel communicates the first heat dissipation opening and an inner space of at least one of the bodies.

In an embodiment of the disclosure, the electronic device includes a heat dissipation fan. The heat dissipation fan is disposed in the inner space of the at least one of the bodies and suitable for providing a heat dissipation air flow. At least a part of the heat dissipation air flow passes through the at least one heat dissipation flow channel and flows out of the electronic device from the at least one first heat dissipation opening.

In an embodiment of the disclosure, the electronic device includes a heat dissipation structure. The heat dissipation structure is disposed in the inner space of the at least one of the bodies and located between the heat dissipation fan and the heat dissipation flow channel. At least a part of the heat dissipation air flow flows along the heat dissipation structure and arrives at the heat dissipation flow channel.

In an embodiment of the disclosure, the electronic device includes a display module. The display module is disposed in the inner space of the at least one of the bodies. The at least one of the bodies has a second heat dissipation opening. A part of the heat dissipation air flow flows along a surface of the display module and flows out of the electronic device from the second heat dissipation opening.

In an embodiment of the disclosure, the number of the at least one first heat dissipation opening is plural. The first heat dissipation openings are formed in at least a part of the shell parts, respectively.

In an embodiment of the disclosure, an overlapping region exists between any two adjacent shell parts. A size of the overlapping region is changed along with relative movement of the shell parts.

In an embodiment of the disclosure, at least one retaining wall is arranged in the hinge cover. The retaining wall separates the hinge assembly from the heat dissipation flow channel.

In an embodiment of the disclosure, each of the shell parts has at least one extending wall. The extending walls of the shell parts are arranged in sequence to constitute the retaining wall.

In an embodiment of the disclosure, the hinge cover has a line channel. A line is suitable for extending from one of the bodies to the other one of the bodies through the line channel. At least one retaining wall is arranged in the hinge cover. The retaining wall separates the line channel from the heat dissipation flow channel.

In an embodiment of the disclosure, each of the shell parts has at least one extending wall. The extending walls of the shell parts are arranged in sequence to constitute the retaining wall.

In an embodiment of the disclosure, the hinge assembly includes a plurality of rotating shafts. The rotating shafts are movably connected to each other in sequence. The shell parts are connected to the rotating shafts, respectively.

In an embodiment of the disclosure, the electronic device includes a plurality of buckle members. The buckle members are installed on the rotating shafts, respectively. Each of the shell parts has at least one buckle part. The buckle parts of the shell parts are buckled on the buckle members, respectively.

In an embodiment of the disclosure, each of the buckle members has a receding notch. When the rotating shafts move relatively, the receding notch provides space for another adjacent buckle member of the buckle members to move.

In light of the above, the hinge cover provided in one or more embodiments of the disclosure is constituted by the shell parts which are movably connected to each other in sequence, and in an actuating process of the hinge assembly, the hinge cover may extend and retract along with relative sliding of the shell parts, so as to properly cover the hinge assembly. In addition, the heat dissipation flow channel and the heat dissipation openings are formed in the hinge cover of the electronic device, so that the heat dissipation air flow in the electronic device may pass through the heat dissipation flow channel and flow out of the electronic device from the heat dissipation openings, whereby the heat dissipation capacity of the electronic device may be improved.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
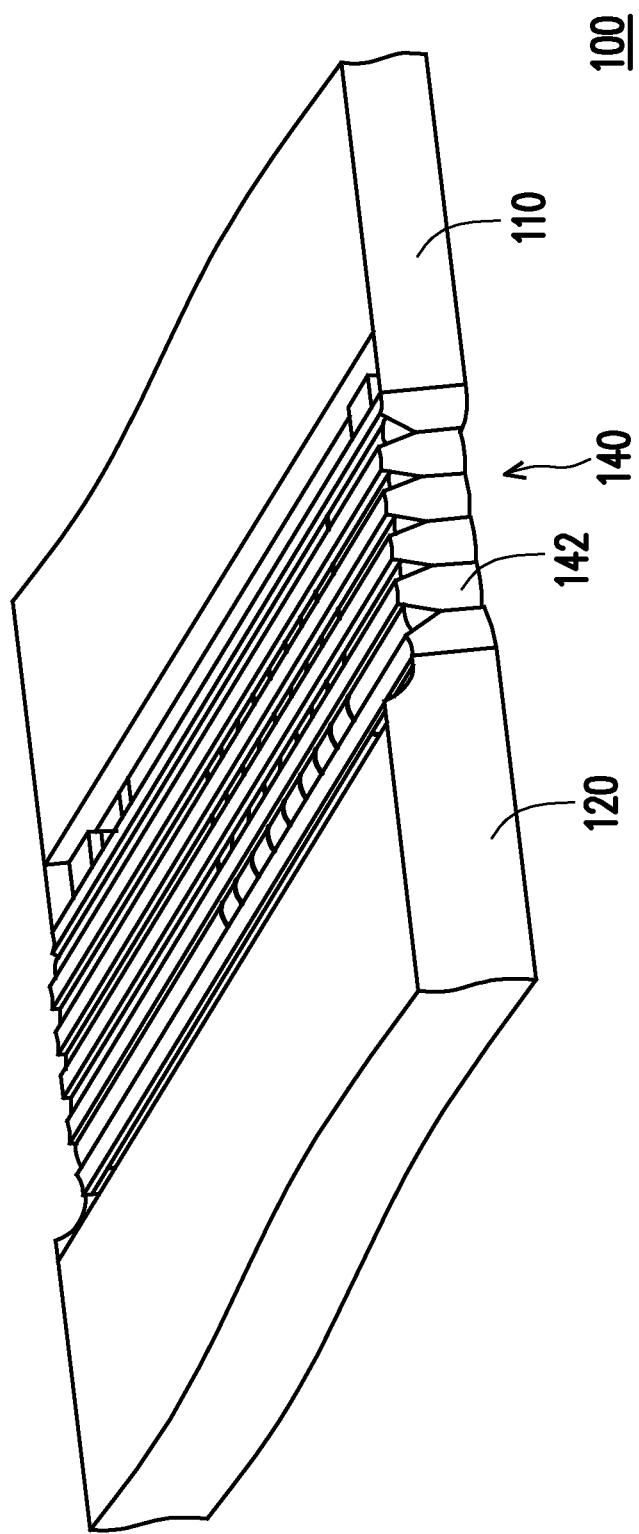
FIG. 1 is a three-dimensional diagram of an electronic device according to an embodiment of the disclosure.
Figure 2:
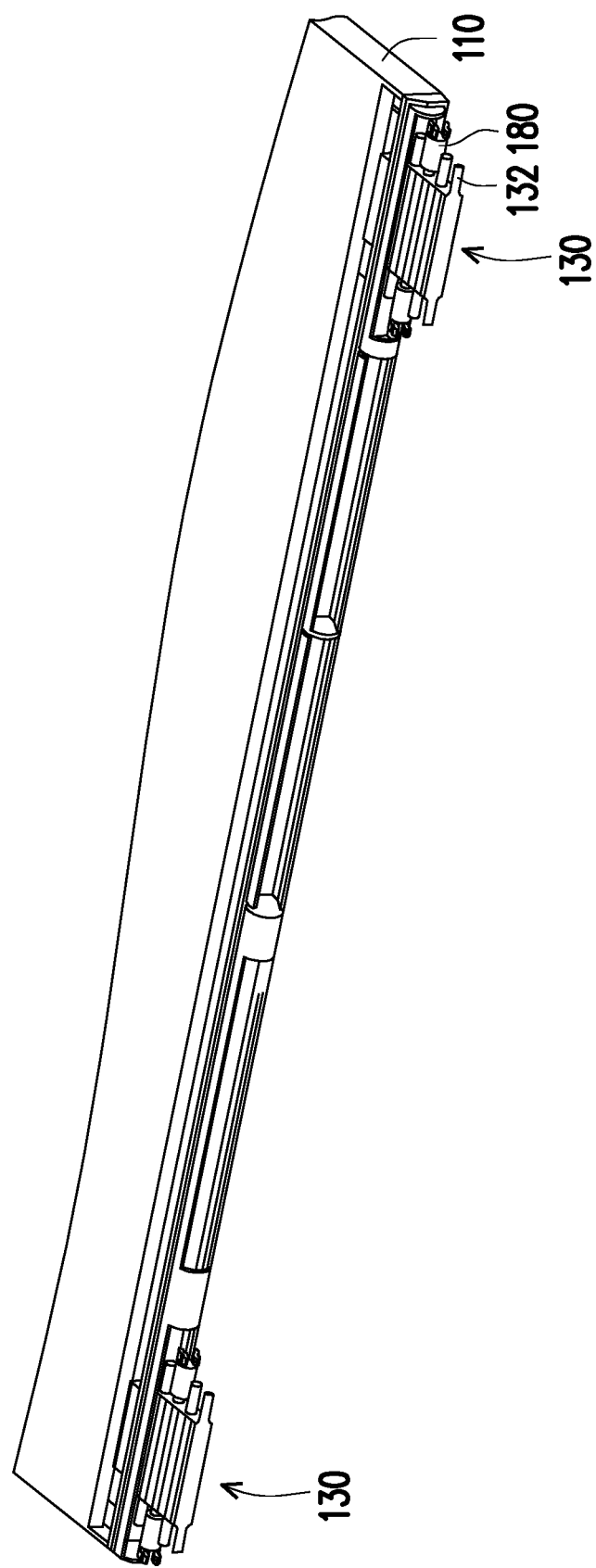
FIG. 2 is a three-dimensional diagram of a part of members of the electronic device in FIG. 1.
Figure 3:
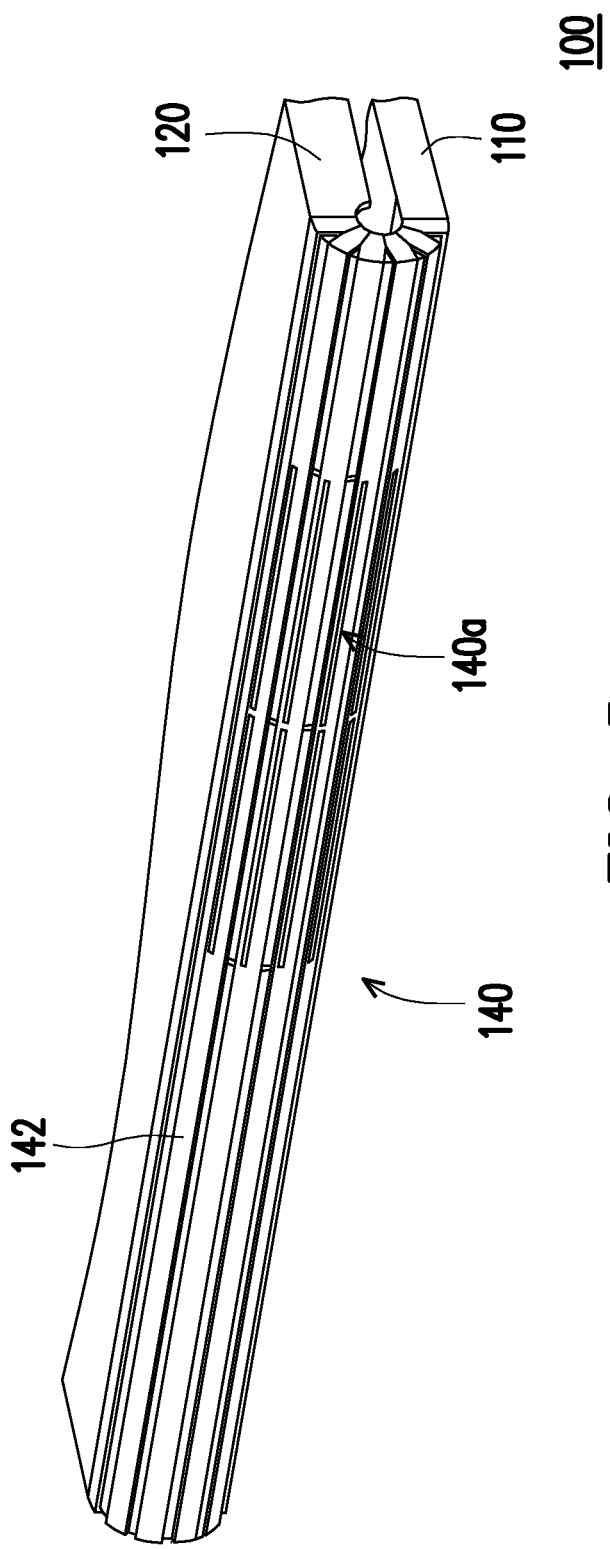
FIG. 3 shows a folded state of the two bodies in FIG. 1.

FIG. 1 is a three-dimensional diagram of an electronic device according to an embodiment of the disclosure. FIG. 2 is a three-dimensional diagram of a part of members of the electronic device in FIG. 1. FIG. 3 shows a folded state of the two bodies in FIG. 1. With reference to FIG. 1 to FIG. 3, an electronic device 100 of the present embodiment is, for example, a notebook computer and includes a body 110, a body 120, at least one hinge assembly 130 (two hinge assemblies are drawn) and a hinge cover 140. The two bodies 110 and 120 are, for example, a host and a screen of the notebook computer respectively, and are pivoted to each other through the hinge assemblies 130, so as to be suitable for being relatively unfolded as shown in FIG. 1 and relatively closed as shown in FIG. 3. The hinge cover 140 is connected between the two bodies 110 and 120 and covers the hinge assemblies 130.

Figure 4:
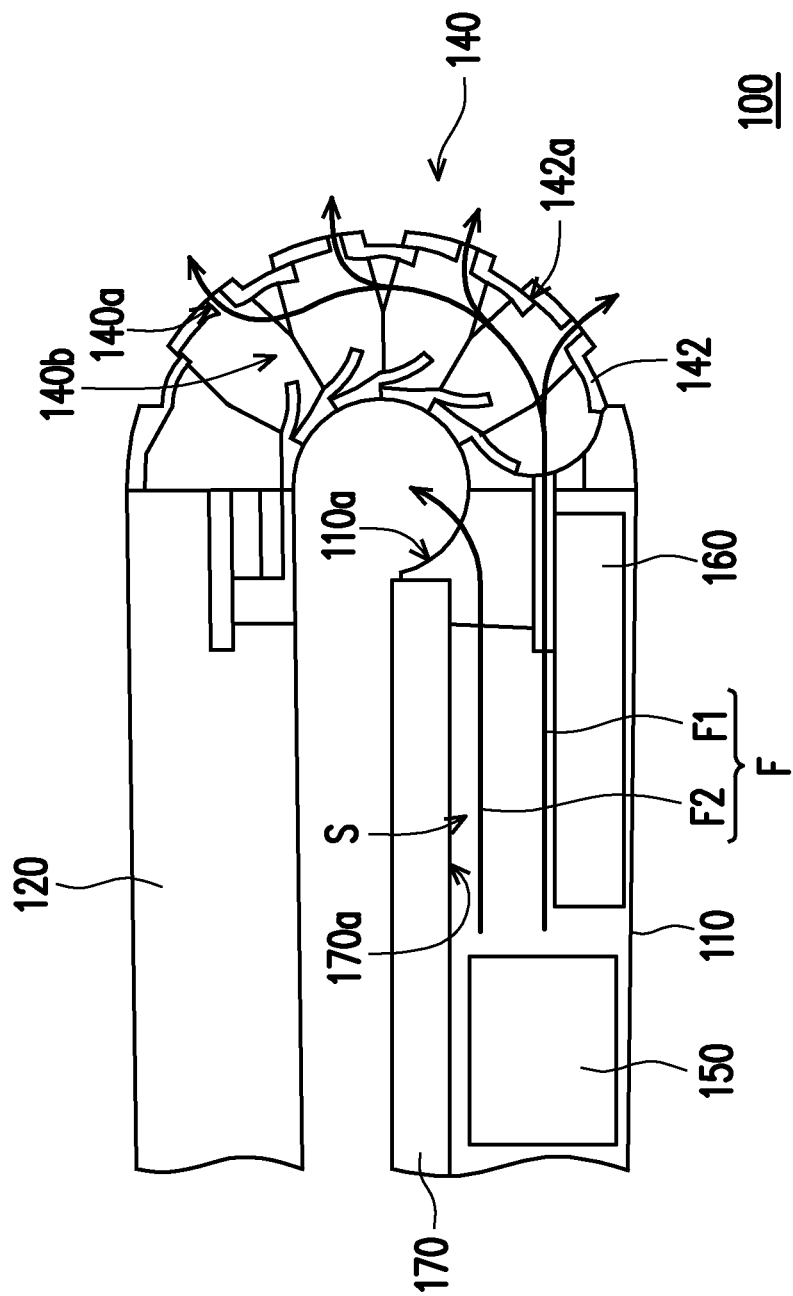
FIG. 4 is a schematic cross-sectional diagram of the electronic device in FIG. 3.

FIG. 4 is a schematic cross-sectional diagram of the electronic device in FIG. 3. Referring to FIG. 1, FIG. 3 and FIG. 4, the hinge cover 140 of the present embodiment includes a plurality of shell parts 142, and the shell parts 142 are movably connected to each other in sequence. In the process that the hinge assemblies 130 actuate along with relative unfolding or folding of the two bodies 110 and 120, an area of an overlapping region 142a (marked in FIG. 4) of any two adjacent shell parts 142 of the hinge cover 140 may be changed by relative sliding of the shell parts 142 so as to enable the hinge cover 140 to extend or retract therewith to properly cover the hinge assemblies 130.

In addition, the hinge cover 140 of the present embodiment has a plurality of first heat dissipation openings 140a (drawn in FIG. 3 and FIG. 4) and at least one heat dissipation flow channel 140b (marked in FIG. 4), the first heat dissipation openings 140a are formed in the shell parts 142, respectively, and the heat dissipation flow channel 140b communicates the first heat dissipation openings 140a and an inner space S of the body 110. Accordingly, a heat dissipation air flow F in the electronic device 100 may pass through the heat dissipation flow channel 140b and flow out of the electronic device 100 from the heat dissipation openings 140a so as to improve the heat dissipation capacity of the electronic device 100. As shown in FIG. 4, in the present embodiment, the heat dissipation openings 140a are only marked on the outer side of the hinge cover 140 (i.e., the right side of the hinge cover 140 in FIG. 4), but when the electronic device 100 is in an unfolded state (the state as shown in FIG. 1), the inner side of the hinge cover 140 (i.e., the left side of the hinge cover 140 in FIG. 4) may also form a heat dissipation opening along with relative movement of the shell parts 142.

In detail, the electronic device 100 of the present embodiment includes a heat dissipation fan 150 and a heat dissipation structure 160 as shown in FIG. 4. The heat dissipation fan 150 is disposed in the inner space S of the body 110 and suitable for providing the heat dissipation air flow F. The heat dissipation structure 160 includes, for example, heat dissipation fins and a heat pipe, and is disposed in the inner space S of the body 110 and located between the heat dissipation fan 150 and the heat dissipation flow channel 140b. Heat of an electronic element (a central processing unit, etc.) in the electronic device 100 is transmitted to the heat dissipation structure 160 so as to be dissipated by the heat dissipation structure 160. A part of the heat dissipation air flow F1 flows along the heat dissipation structure 160, then passes through the heat dissipation flow channel 140b and flows out of the electronic device 100 from the first heat dissipation openings 140a, so as to smoothly move heat of the heat dissipation structure 160 out of the electronic device 100.

In addition, the electronic device 100 of the present embodiment further includes a display module 170. The display module 170 is disposed in the inner space S of the body 110. The body 110 has a second heat dissipation opening 110a, and a part of the heat dissipation air flow F2 flows along a surface 170a of the display module 170 and flows out of the electronic device 100 from the second heat dissipation opening 110a. Accordingly, the heat dissipation air flow F2 may be blocked between the display module 170 and the heat dissipation structure 160 so as to avoid an adverse influence of the heat of the heat dissipation structure 160 on the display module 170.

Figure 5:
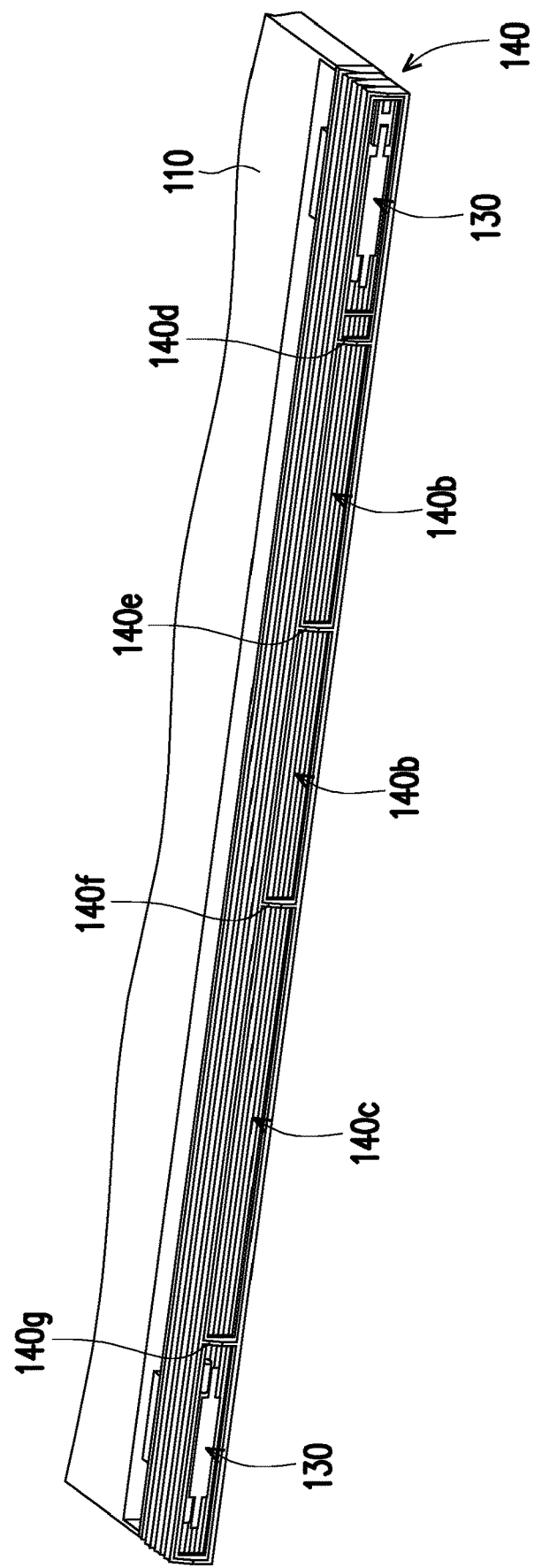
FIG. 5 is a three-dimensional diagram of a part of members of the electronic device in FIG. 1.

FIG. 5 is a three-dimensional diagram of a part of members of the electronic device in FIG. 1. Referring to FIG. 5, there are two heat dissipation flow channels 140b of the hinge cover 140 of the present embodiment. The hinge cover 140 further has a line channel 140c, and a line (e.g., a flat cable) is suitable for extending to the body 120 from the body 110 through the line channel 140c so as to make the body 110 and the body 120 transmit signals. Further, a plurality of retaining walls 140d, 140e, 140f and 140g are arranged in the hinge cover 140. The retaining wall 140d separates one hinge assembly 130 from one heat dissipation flow channel 140b. The retaining wall 140e separates two heat dissipation flow channels 140b from each other. The retaining wall 140f separates one hinge assembly 130 from the line channel 140c. The retaining wall 140g separates the line channel 140c from one hinge assembly 130. Accordingly, the heat dissipation air flow F1 (drawn in FIG. 4) may be made to flow along the heat dissipation flow channels 140b in deed, which may avoid an adverse influence of the high-temperature heat dissipation air flow F1 on the hinge assemblies 130 and the line in the line channel 140c.

Figure 6:
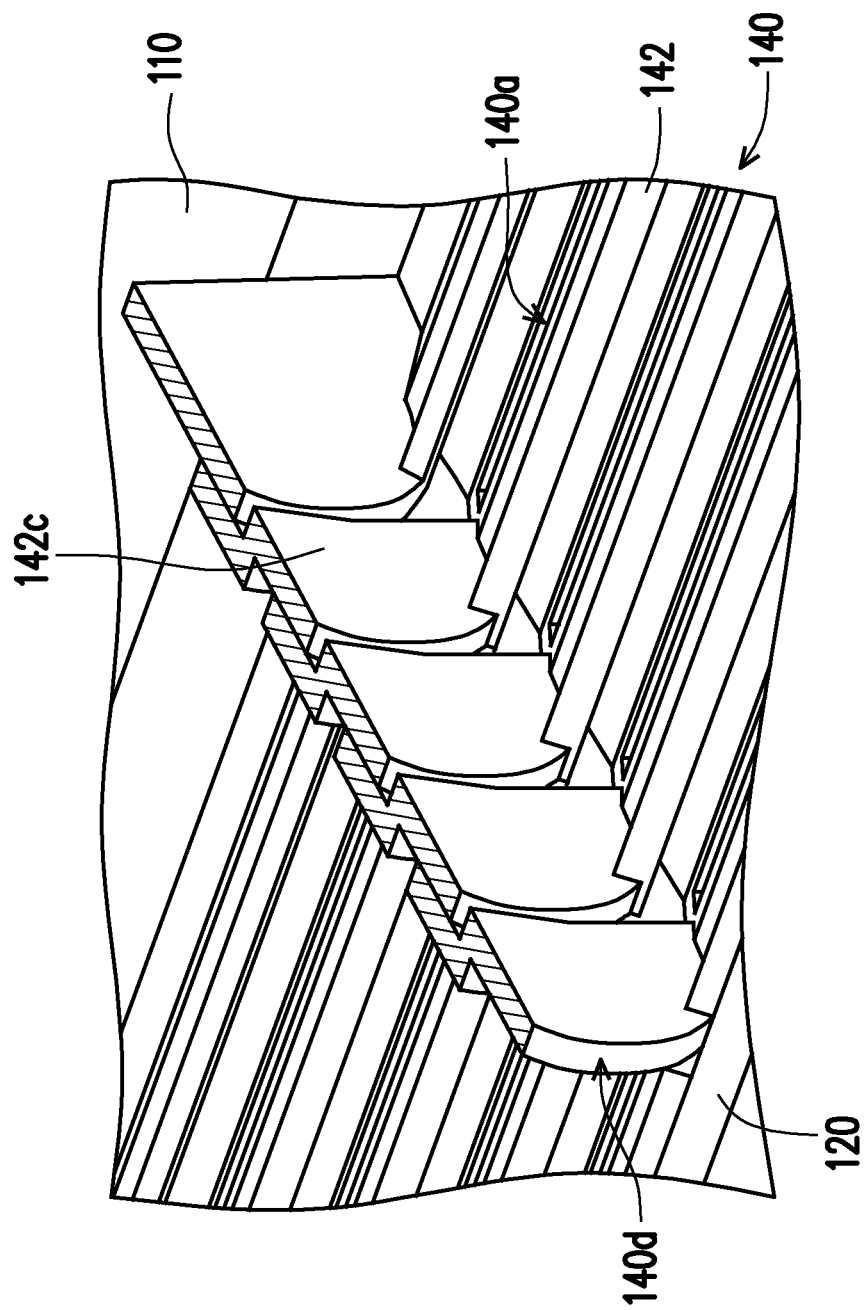
FIG. 6 shows a partial structure of the hinge cover in FIG. 5.

FIG. 6 shows a partial structure of the hinge cover in FIG. 5. Referring to FIG. 6, each of the shell parts 142 of the present embodiment has at least one extending wall 142c, and these extending walls 142c of these shell parts 142 are arranged in sequence to constitute the retaining wall 140d. The retaining walls 140e, 140f and 140g may also be constituted in the same or similar way, which is omitted herein.

Figure 7:
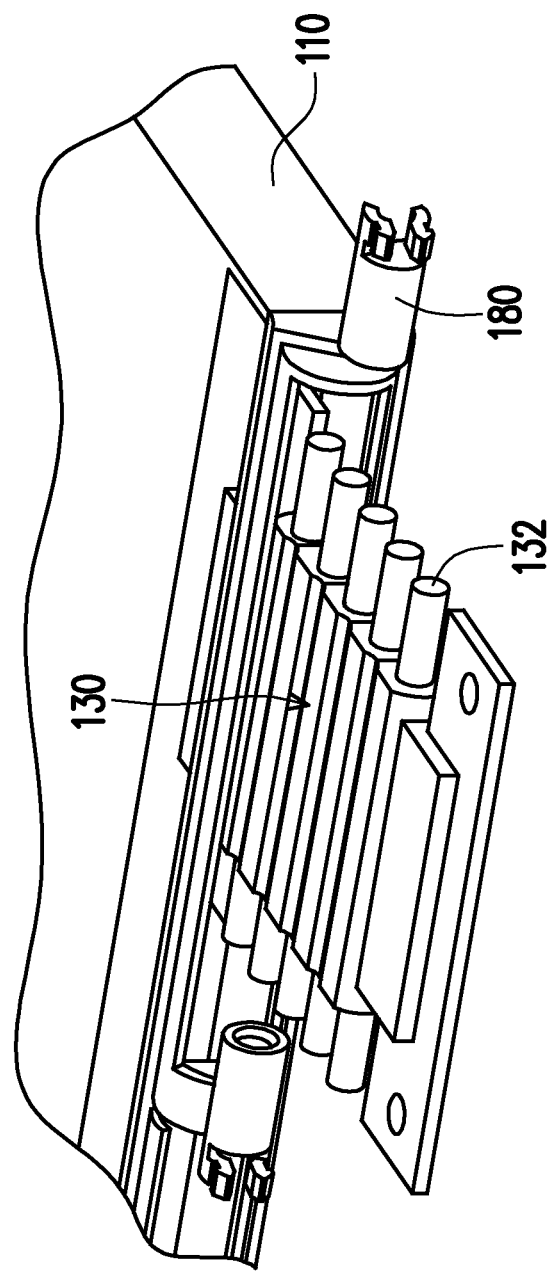
FIG. 7 is an exploded view of a part of members of the electronic device in FIG. 1.
Figure 8:
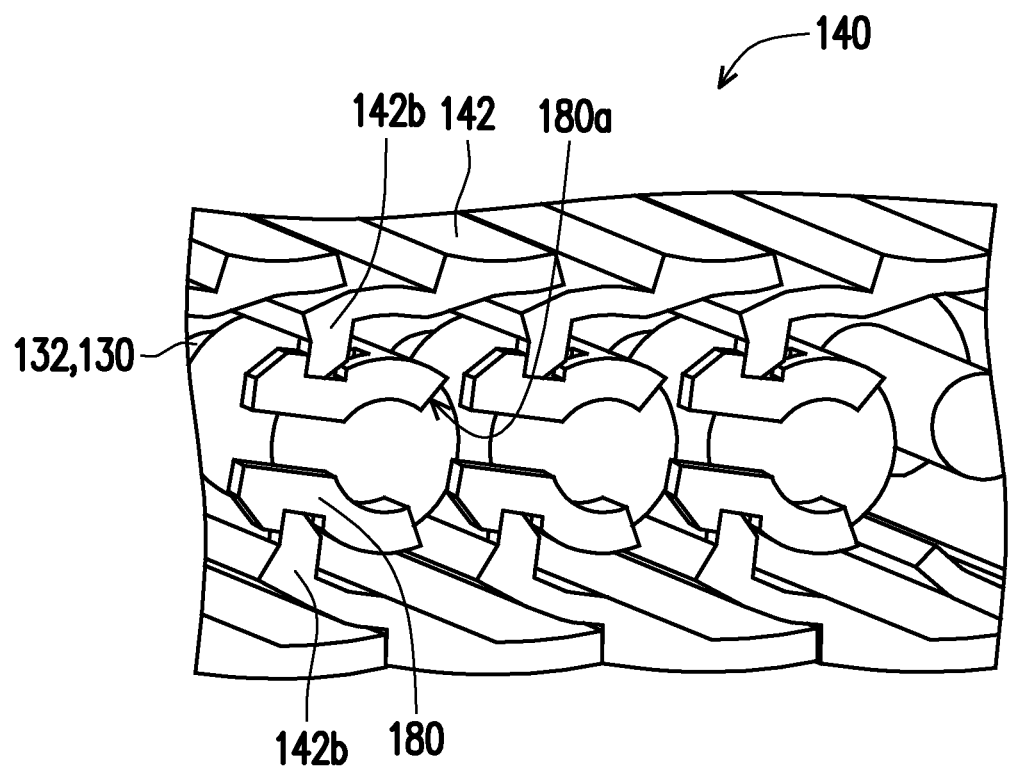
FIG. 8 is a partial three-dimensional diagram of the electronic device in FIG. 1.
Figure 9:
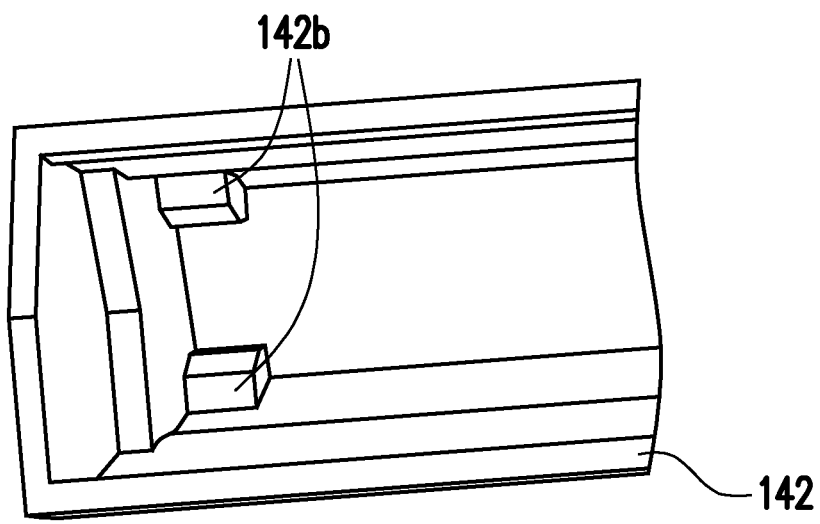
FIG. 9 is a partial three-dimensional diagram of the shell parts in FIG. 1.

FIG. 7 is an exploded view of a part of members of the electronic device in FIG. 1. FIG. 8 is a partial three-dimensional diagram of the electronic device in FIG. 1. FIG. 9 is a partial three-dimensional diagram of the shell parts in FIG. 1. Referring to FIG. 7 to FIG. 9, the hinge assembly 130 of the present embodiment includes a plurality of rotating shafts 132 to form a multi-shaft type hinge assembly, and these rotating shafts 132 are movably connected to each other in sequence. The electronic device 100 further includes a plurality of buckle members 180, and these buckle members 180 are, for example, plastic pieces and installed on these rotating shafts 132 in a sleeving manner respectively. Each of the shell parts 142 has at least one buckle part 142d, and these buckle parts 142b are buckled on these buckle members 180 respectively so as to make these shell parts 142 connected to these rotating shafts 132 respectively. Accordingly, these shell parts 142 may be assembled without screw locks, so that the assembling process may be simplified. Further, each of the buckle members 180 has a receding notch 180a as shown in FIG. 8. When the rotating shafts 132 relatively move, the receding notch 180a provides space for another adjacent buckle member 180 to move, so as to avoid the situation that the hinge assemblies 130 cannot smoothly actuate due to structure interference between the buckle members 180.

To sum up, the hinge cover provided in one or more embodiments of the disclosure is constituted by the shell parts that are movably connected to each other in sequence, and in the actuating process of the hinge assembly, the hinge cover may extend and retract along with relative sliding of the shell parts, so as to properly cover the hinge assemblies. In addition, the heat dissipation flow channel and the heat dissipation openings are formed in the hinge cover of the electronic device, so that the heat dissipation air flow in the electronic device may pass through the heat dissipation flow channel and flow out of the electronic device from the heat dissipation openings to improve the heat dissipation capacity of the electronic device. In addition, the shell parts of the hinge cover may be buckled on the buckle members on the hinge assemblies, so that the hinge cover may be assembled without screw locks to simplify the assembling process.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   two bodies;
   at least one hinge assembly, wherein the two bodies are pivoted to each other through the at least one hinge assembly; and
   a hinge cover, connected between the two bodies and covering the at least one hinge assembly, the hinge cover comprising a plurality of shell parts movably connected to each other in sequence, at least one first heat dissipation opening, and at least one heat dissipation flow channel, wherein the at least one heat dissipation flow channel communicates with the at least one first heat dissipation opening and an inner space of at least one of the bodies.

2. The electronic device according to claim 1, comprising a heat dissipation fan disposed in the inner space of the at least one of the bodies and adapted to provide a heat dissipation air flow, wherein at least a part of the heat dissipation air flow passes through the at least one heat dissipation flow channel and flows out of the electronic device from the at least one first heat dissipation opening.

3. The electronic device according to claim 2, comprising a heat dissipation structure disposed in the inner space of the at least one of the bodies and located between the heat dissipation fan and the at least one heat dissipation flow channel, wherein at least a part of the heat dissipation air flow flows along the heat dissipation structure and arrives at the at least one heat dissipation flow channel.

4. The electronic device according to claim 2, comprising a display module disposed in the inner space of the at least one of the bodies, wherein the at least one of the bodies comprises a second heat dissipation opening, and a part of the heat dissipation air flow flows along a surface of the display module and flows out of the electronic device from the second heat dissipation opening.

5. The electronic device according to claim 1, wherein the number of the at least one first heat dissipation opening is plural, and the first heat dissipation openings are formed in at least a part of the shell parts, respectively.

6. The electronic device according to claim 1, wherein an overlapping region exists between any two adjacent shell parts of the shell parts, and a size of the overlapping region is changed along with relative movement of the shell parts.

7. The electronic device according to claim 1, wherein at least one retaining wall is arranged in the hinge cover, and the at least one retaining wall separates the at least one hinge assembly from the at least one heat dissipation flow channel.

8. The electronic device according to claim 7, wherein each of the shell parts comprises at least one extending wall, and the extending walls of the shell parts are arranged in sequence to constitute the at least one retaining wall.

9. The electronic device according to claim 1, wherein the hinge cover comprises a line channel, a line is suitable for extending from one of the bodies to the other one of the bodies through the line channel, at least one retaining wall is arranged in the hinge cover, and the at least one retaining wall separates the line channel from the at least one heat dissipation flow channel.

10. The electronic device according to claim 9, wherein each of the shell parts comprises at least one extending wall, and the extending walls of the shell parts are arranged in sequence to constitute the at least one retaining wall.

11. The electronic device according to claim 1, wherein the at least one hinge assembly comprises a plurality of rotating shafts movably connected to each other in sequence, and the shell parts are connected to the rotating shafts, respectively.

12. The electronic device according to claim 11, comprising a plurality of buckle members installed on the rotating shafts, respectively, wherein each of the shell parts comprises at least one buckle part, and the buckle parts of the shell parts are buckled on the plurality of buckle members, respectively.

13. The electronic device according to claim 12, wherein each buckle member of the plurality of buckle members comprises a receding notch, and when the rotating shafts move relatively, the receding notch provides space for another adjacent buckle member of the plurality of buckle members to move.

* * * * *